United States Patent
Ahmed et al.

(10) Patent No.: US 9,535,133 B2
(45) Date of Patent: Jan. 3, 2017

(54) INDUSTRIAL SYSTEM PHASE SAG DETECTION

(71) Applicant: ROCKWELL AUTOMATION TECHNOLOGIES, INC., Mayfield Heights, OH (US)

(72) Inventors: Ahmed Mohamed Sayed Ahmed, Mequon, WI (US); Brian J. Seibel, Grafton, WI (US); Russel Kerkman, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 171 days.

(21) Appl. No.: 14/071,911

(22) Filed: Nov. 5, 2013

(65) Prior Publication Data

US 2015/0123700 A1   May 7, 2015

(51) Int. Cl.
| | | |
|---|---|---|
| *G01R 31/40* | (2014.01) | |
| *H02J 3/24* | (2006.01) | |
| *H02J 13/00* | (2006.01) | |
| *H02J 9/06* | (2006.01) | |

(52) U.S. Cl.
CPC ............... *G01R 31/40* (2013.01); *H02J 3/24* (2013.01); *H02J 9/06* (2013.01); *H02J 13/0006* (2013.01); *Y02B 70/3291* (2013.01); *Y02B 90/222* (2013.01); *Y04S 20/12* (2013.01); *Y04S 20/248* (2013.01)

(58) Field of Classification Search
CPC ............ G01R 31/40; G01R 31/42; H02J 9/06; H02J 3/24; H02J 13/0006; Y02B 90/222; Y02B 70/3291; Y04S 20/248; Y04S 20/12
See application file for complete search history.

(56) References Cited

U.S. PATENT DOCUMENTS

| | | | | |
|---|---|---|---|---|
| 4,713,604 A | * | 12/1987 | Becker | ...................... H02H 7/16 324/500 |
| 5,602,462 A | | 2/1997 | Stich et al. | |
| 7,800,349 B2 | * | 9/2010 | Tsang | ........................ H02J 3/24 323/255 |
| 8,352,203 B2 | * | 1/2013 | Seibel | ..................... G06F 17/00 702/75 |

(Continued)

FOREIGN PATENT DOCUMENTS

| | | |
|---|---|---|
| EP | 0416569 A2 | 3/1991 |
| JP | 2002101575 A | 4/2002 |
| JP | 2006254537 A | 9/2006 |

OTHER PUBLICATIONS

P. Ananthababu; B. Trinadha; K. R. Charan; Performance of Dynamic Voltage Restorer (DVR) against Voltage Sags and Swells Using Space Vector PWM Technique; IEEE Conference Publications; 2009; pp. 206-210.*

*Primary Examiner* — Son Le (57) ABSTRACT

Described herein are methods, systems, and apparatuses for determining sag in a signal. In one example, a method of tracking sag in a signal includes, when in an initial state, monitoring for when the signal transitions to a sag state based at least on an output of a tracking filter. In response to the signal transitioning to the sag state, increasing a bandwidth of the tracking filter and, when in the sag state, monitoring for when the signal transitions to a recovering state. The method further includes, in response to the signal transitioning to the recovering state, decreasing the bandwidth of the tracking filter.

19 Claims, 10 Drawing Sheets

(56) References Cited

U.S. PATENT DOCUMENTS

2006/0164782 A1 7/2006 Colombi et al.
2011/0199072 A1* 8/2011 Kerkman ............... G01R 29/18
                                                            324/76.77

* cited by examiner

INDUSTRIAL SYSTEM PHASE SAG DETECTION

TECHNICAL BACKGROUND

Maintaining precise power for industrial devices is an important aspect for control systems for these devices. Control systems often include motion and motor controllers, actuator controllers, among many other control devices. The industrial devices being controlled may include motors, and multi-axis robots within complex manufacturing processes, among other industrial devices.

Abnormal grid conditions, such as voltage sags, may cause a converter for the industrial device to fault or malfunction, thus affecting system reliability. In some instances, an over current fault cannot be automatically reset, which then requires manual resetting that costs both time and resources. Further, voltage sags can affect controller performance and lead to the injection of undesirable current harmonics to the grid, and may also result in excessive stresses on power components within the converter. For all of these reasons, it is important that the power supplied to these complex devices remain within an acceptable range and accurate to ensure proper productivity. Without monitoring the power, the efficiency of the often-expensive devices may suffer or come to a halt as a result of improper power supplies.

OVERVIEW

Described herein are methods, systems, and apparatuses for signal sag detection. In one example, a method of tracking sag in a signal includes, when in an initial state, monitoring for when the signal transitions to a sag state based at least on an output of a tracking filter. In response to the signal transitioning to the sag state, increasing a bandwidth of the tracking filter and, when in the sag state, monitoring for when the signal transitions to a recovering state. The method further includes, in response to the signal transitioning to the recovering state, decreasing the bandwidth of the tracking filter.

In another example, an apparatus for tracking sag in a signal includes a sag detection module configured to, when in an initial state, monitor for when the signal transitions to a sag state based at least on an output of a tracking filter. The apparatus further includes a sag recovery module configured to, when in the sag state, monitor for when the signal transitions to a recovering state. The apparatus further provides a bandwidth determination module configured to, in response to the signal transitioning to the sag state, increase a bandwidth of the tracking filter and, in response to the signal transitioning to the recovering state, decreasing the bandwidth of the tracking filter.

In another instance, an apparatus for tracking sag for a plurality of phase signals includes a sag detection module configured to, when in an initial state, monitor for when at least one of the plurality of phase signals transition to a sag state based at least on the output of one or more tracking filters. The apparatus further includes a sag recovery module configured to, when in the sag state, monitor for when the plurality of phase signals transition to a recovering state. The apparatus also includes a bandwidth determination module configured to, in response to the phase signals transitioning to the sag state, increasing a bandwidth in the one or more tracking filters and, in response to the signal transitioning to the recovering state, decreasing the bandwidth in the one or more tracking filters.

DETAILED DESCRIPTION

The following description and associated drawings teach the best mode of the invention. For the purpose of teaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by claims and their equivalents.

The precision and accuracy of input power for industrial devices may be vitally important to properly control the industrial systems. The industrial control devices may include application-specific integrated circuits, printed circuit boards, and other electronic components. To ensure the industrial control devices operate properly, power must remain constant and accurate. If a power phase sags or is not constant, the control of the industrial devices may be improper and the operation of the industrial device may be impaired or dangerous to the operators of the device.

Abnormal grid conditions, such as voltage sags may cause industrial control devices to have an issue with over current fault, thus affecting system reliability and productivity. Over current fault may not have the ability to be automatically reset, which requires manual resetting of the fault, rendering the drive non compliant with some government design requirements. Voltage sags can also affect industrial controller performance, which may lead to the injection of undesirable current harmonics with significant magnitude to the grid. Further, voltage sags may result in high current root-mean-square (RMS) values, which consequently can lead to excessive stresses on electrical components in various industrial control devices. As a result, many industrial control devices and systems require fast and reliable detection of the line sag conditions, so that proper actions may be taken. Some of these actions may include reconfiguring controller operation command changes upon sag detection, or temporarily disabling the device or system during severe sag conditions.

Figure 1:
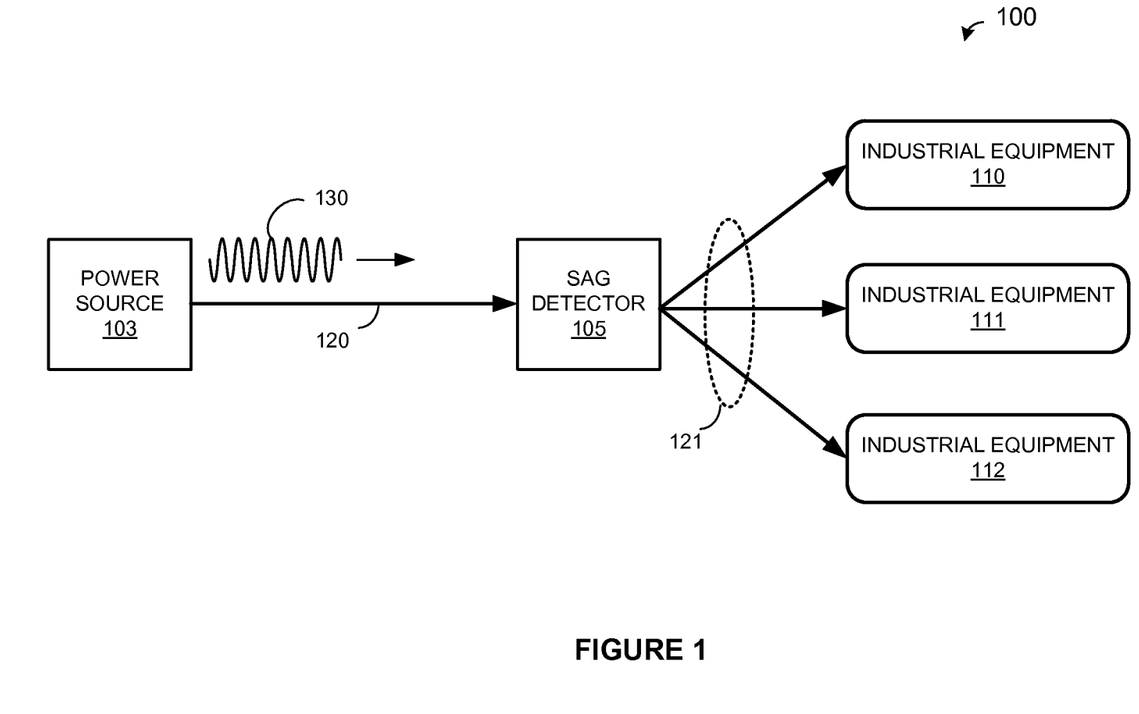
FIG. 1 illustrates a power sag detection system.

FIG. 1 illustrates a power system 100 with sag detection according to at least one example. FIG. 1 includes power source 103, power signal 130, sag detector 105, and industrial equipment 110-112. Power source 103 is configured to connect to sag detector 105 using link 120, which may comprise a cable or any other conductor capable of carrying power, such as power signal 130. Sag detector 105 is further connected to industrial equipment 110-112 using links 121. Links 121 may include any communication medium to communicate sag notifications to industrial equipment 110-112.

In operation, power source 103 will produce alternating current electricity to power industrial equipment 110-112. The power produced will be transmitted as a sinusoid or plurality of sinusoids, similar to power signal 130. Power signal 130 may have an intended root mean squared voltage of 120 volts, 240 volts, 480 volts, or any other voltage. Further, power signal 130 may be transmitted at any frequency from power source 103. Sag detector 105 is configured to receive the power from power source 103 and monitor the power for any sag or dip in the voltage that is provided. For example, if a power source is supposed to be providing a signal with an amplitude of 80 volts, then Sag detector 105 should indicate when this amplitude drops below the expected 80 volts. In some instances, sag detector 105 may only worry about a sag or a dip if the drop is over a threshold amount. Thus, returning to the previous example, if the power source is supposed to provide an amplitude of 80 volts then the sag detector may only identify sags when the amplitude drops below 75 volts or some other threshold value. Upon the detection of a sag, sag detector 105 may be configured to stop power from being transmitted to any of industrial equipment 110-112, or may provide proper power by some other means, such as another generator or other supplemental power source. In other examples, sag detector 105 may provide a flag to industrial equipment 110-112 indicating that there is a sag in the voltage, and industrial equipment 110-112 may react accordingly.

Although illustrated as a sag detector for three items of industrial equipment, it should be understood that sag detector 105 may apply for any number of industrial equipment elements. Further, it should be understood that sag detector 105 may reside wholly or partially on the elements of industrial equipment. Thus, in some examples, sag detector 105 may reside as a piece of control hardware or software on industrial equipment 110-112.

Figure 2:
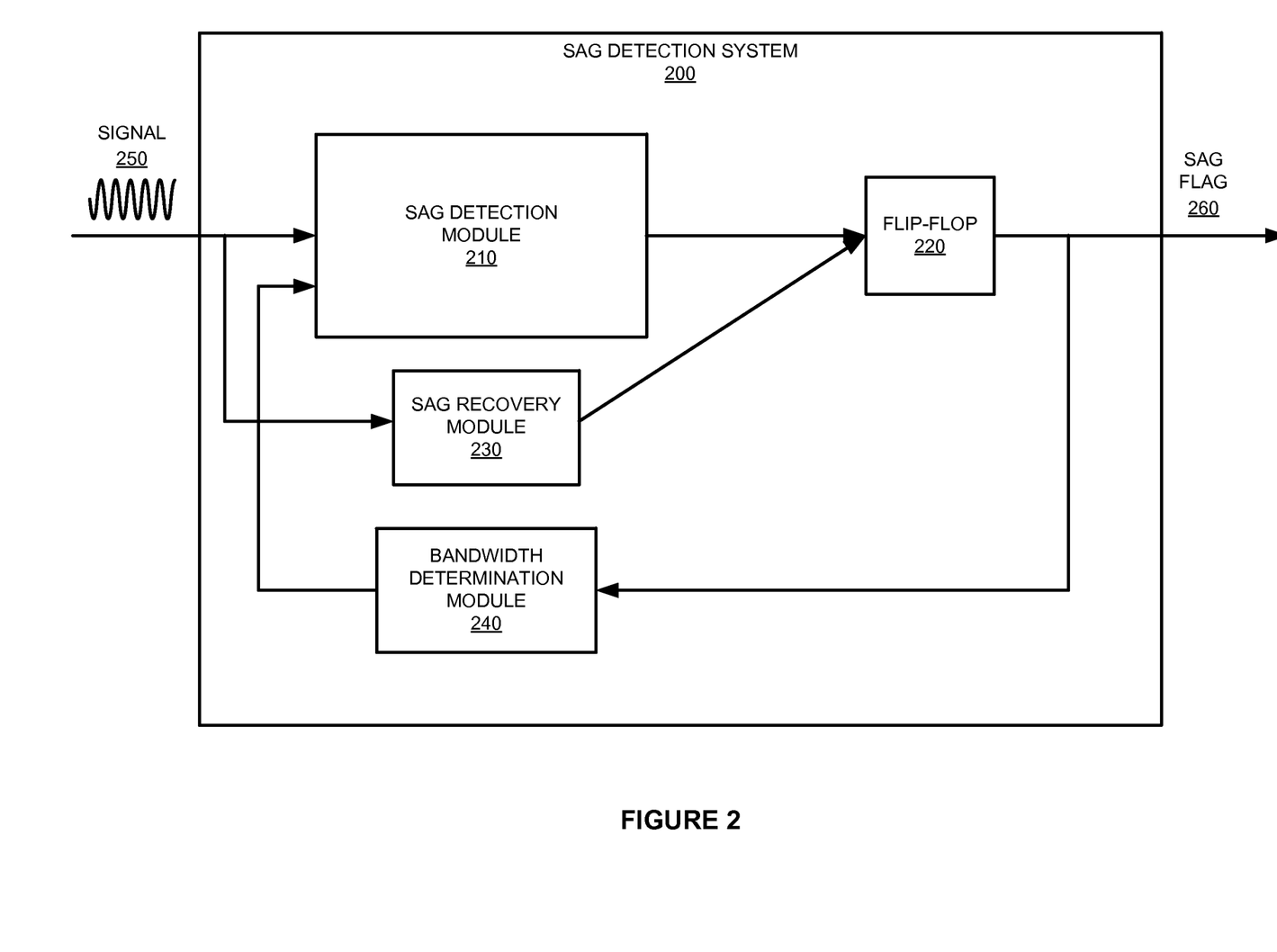
FIG. 2 illustrates a sag detection system for finding sags in an input signal.

To better illustrate the operation of sag detector 105, FIG. 2 illustrates a sag detection system 200. Sag detection system 200 is an example of sag detector 105 although other examples may exist. Sag detection system 200 includes sag detection module 210, flip-flop 220, sag recovery module 230, bandwidth determination module 240, signal 250, and sag flag 260.

In operation, sag detection system 200 is configured with multiple states that are defined by sag flag 260. Sag flag 260 may indicate that sag detection system 200 is in an initial or recovering state or, in the alternative, a sag state. The initial or recovering state indicates that signal 250 is being passed to sag detection system 200 in the normal expected way, such as with the proper amplitude for the signal. In contrast, the sag state indicates that the amplitude for signal 250 has dropped and is no longer at the expected level.

Signal 250, which may comprise a sinusoidal voltage waveform, is received for processing by sag detection system 200. Signal 250 is then directed within sag detection system 200 to sag detection module 210 and sag recovery module 230. Sag detection module 210 is configured, in the initial or recovering state, to determine when signal 250 sags or drops below an expected value for the waveform. In some examples, the detection of sag may be based on the output of a tracking filter or adaptive tracking filter within sag detection module 210. The output of this filter may then be compared to input signal 250 to determine if any sag exists. Upon detection of a sag, sag detection module 210 will deliver a notification to flip-flop 220 indicating that signal 250 has dropped into the sag state. Accordingly, sag flag 260 will reflect this sag notification and pass this information on to one or more industrial devices.

In addition to being passed to one or more industrial devices, sag flag 260 may be passed to bandwidth determination module 240. Bandwidth determination module 240 is configured to set the bandwidth for sag detection module 210 for the two different sag flag 260 states. The first state is an initial or recovering state that reflects when signal 250 is at a proper voltage or a recovering voltage. The second state is a sag state, which reflects when signal 250 is at an improper sag or low voltage. In the initial state, bandwidth determination module 240 is configured to set the bandwidth to an initial bandwidth, such as 20-40 radians/second. This bandwidth allows sag detection module 210 to quickly identify a sag in signal 250. In contrast, once in the sag state, bandwidth determination module 240 is configured to increase the bandwidth from the initial state that is supplied to sag detection module 210. This increased bandwidth may be of any increased value and allows for sag detection module 210 to track the signal despite the signal dropping to the sag state and enables the detection of a repeated sag condition.

Similar to sag detection module 210 identifying when signal 250 drops into a sag state, sag recovery module 230 is configured to determine when signal 250 returns to the initial or recovering state. Sag recovery module 230 may be configured to find the space vector magnitude of signal 250 at any given time and compare that magnitude to a threshold magnitude. The threshold magnitude should be set at or near the magnitude of the signal when there is not a sag in the signal. Upon finding that signal 250 has crossed this threshold magnitude, an indication is sent to flip-flop 220 to change the state of sag flag 260 back to the initial or recovering state.

Figure 3:
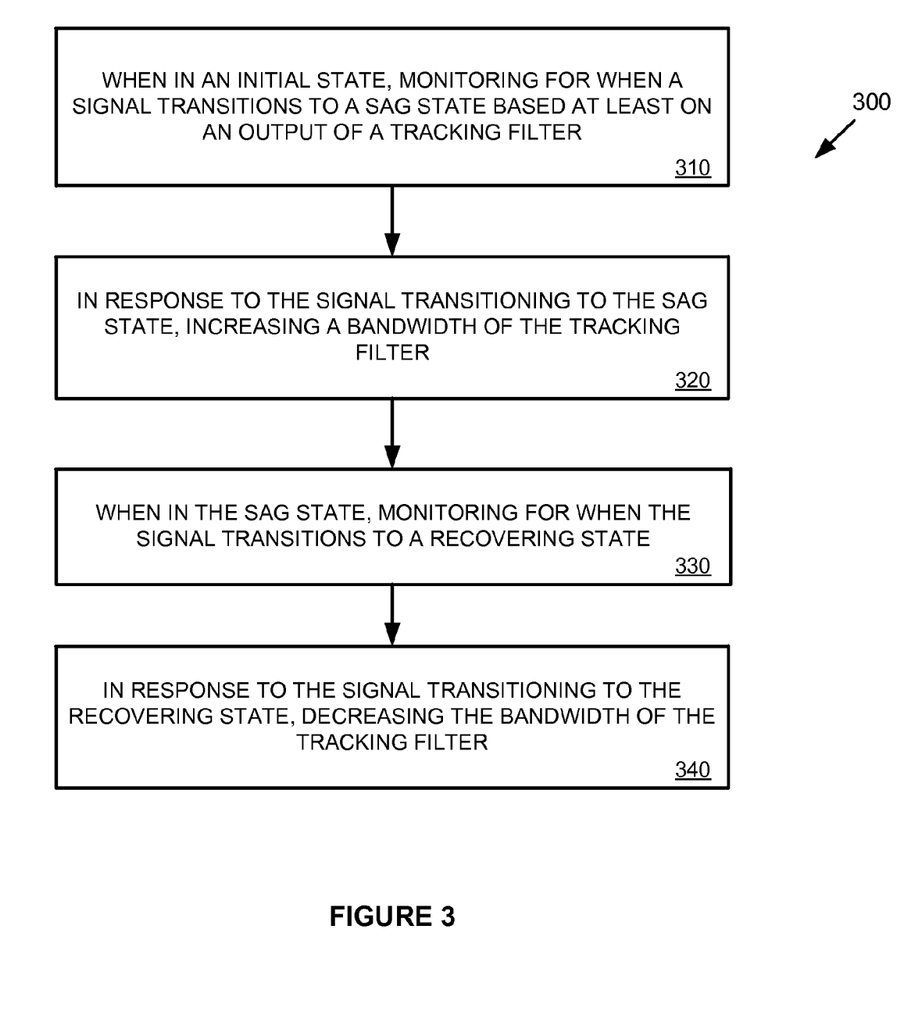
FIG. 3 illustrates a method for sag detection.

To further illustrate the operation of sag detection system 200, method 300 is included for identifying power sag in a signal. Method 300 includes, when in an initial state, monitoring for when a signal transitions to a sag state based at least on an output of a tracking filter (310). Referring to sag detection system 200, sag detection system 200 is capable of two states represented by sag flag 260, an initial or recovering state that occurs when signal 260 is operating under normal or close to normal conditions, such as with the proper amplitude and frequency, amongst other characteristics, and a sag state that occurs when the amplitude of signal 250 drops below the expected amplitude for the signal. In the present example, a signal, such as signal 250, will be directed toward a sag determination module to identify if the signal is sagging below the expected value. The sag determination module may feed the signal through a tracking filter and compare the output of the filter with the signal itself to determine if there is any sag in the signal. In some instances, the tracking filter may be set as a dynamic band pass filter with a center frequency at the expected frequency for the signal and an initial bandwidth, such as 20 to 40 radians/second. As a result, if the signal is in a sag condition, then the comparison between the output of the filter and the signal itself will be a non-zero value. In some occurrences, this non-zero value may be compared with a threshold to determine if the signal is truly in a sag state.

In response to the signal transitioning to the sag state, the method further provides increasing the bandwidth of the tracking filter (320). By increasing the bandwidth in the tracking filter, this allows the filter to more easily monitor and identify the signal. If the bandwidth were not changed, then the tracking filter may lose tracking of the signal. As a result, if the system were to revert to the initial or recovering state, there would be a delay while the tracking filter attempted to relocate the signal. This might cause the tracking filter to miss the next sag in the signal and, consequently, cause damage to any equipment being supplied power from the signal.

Once the sag detection system has been placed in the sag state, the system will then monitor for when the signal transitions to the recovering state (330). In some instances, the system will monitor for recovery using a sag recovery module, such as sag recovery module 230. The sag recovery module may be configured to calculate the space vector magnitude of the input signal and compare that magnitude to a threshold magnitude. The space vector magnitude may also be fed directly from a phase locked loop or any other means. Thus, if the magnitude of a voltage signal is supposed to be 220 volts, a threshold value may be set to 200 volts to determine that the signal has reached a recovering state. Once this threshold has been reached, the sag recovery module may transition the sag detection system to a recovering state.

In response to the signal transitioning to the recovering state, the method further provides decreasing the bandwidth of the tracking filter (340). As described above, the tracking filter is configured with a wider bandwidth during the sag state to ensure that the tracking filter can continue to track the signal. If the bandwidth was not widened, the filter may lose track of the signal and have to search for the signal upon return to the recovering or initial state. This may cause the filter to miss the next sag in the voltage signal and result in possible issues for the equipment being supplied with the power. Thus, by returning the tracking filter to a lower bandwidth upon identification of a recovering state, the tracking filter may be able to maintain tracking during the sag using the wider bandwidth and detect the next sag with the lower bandwidth.

Figure 4:
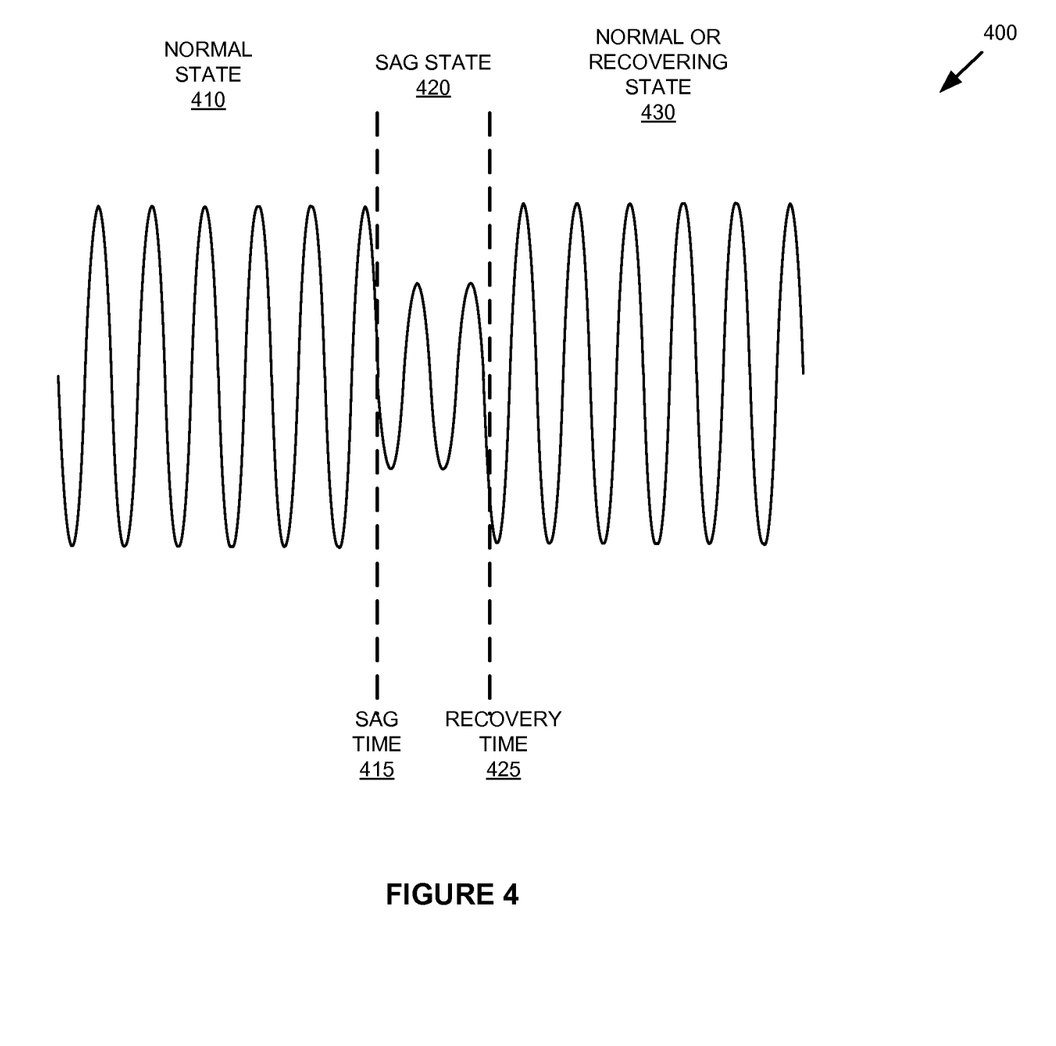
FIG. 4 illustrates a signal with voltage sag.

FIG. 4 illustrates an example voltage signal 400 with voltage sag. Voltage signal 400 includes initial or normal state 410, sag state 420, and normal or recovering state 430. In operation, voltage signal 400 may be passed to a sag detector, such as sag detector 105 or sag detection system 200, among other sag detection systems. The sag detector is configured to identify when the voltage in signal 400 drops to a sag state from a normal or expected state.

In the present example, signal 400 remains in normal state 410 until the signal hits sag time 415. Upon reaching the sag, the sag detector is configured to identify the sag using a sag detection module that includes at least a tracking filter, and transition the sag detector into sag state 420. Upon transitioning into sag state 420, the sag detector is then configured to determine when signal 400 returns to normal or recovering state 430. Here, the sag detector should determine the transition at or around recovery time 425. The sag detector in some instances may make this determination based on measuring the space vector magnitude of signal 400 and comparing the magnitude to a threshold recovery magnitude. Upon the recovery determination, the sag detector should transition to normal or recovering state 430 and attempt to look for the next sag in the voltage.

Figure 5:
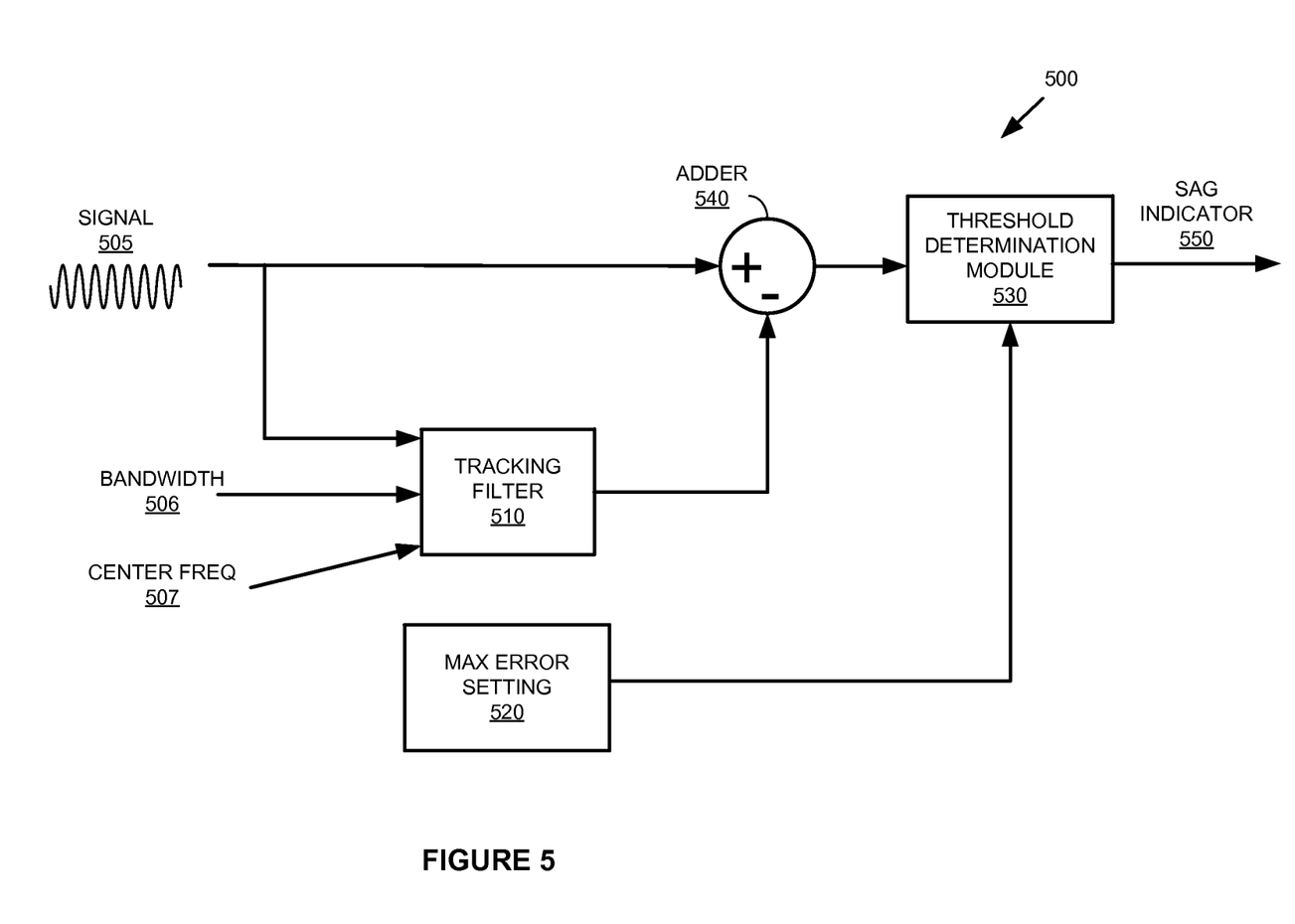
FIG. 5 illustrates a sag determination module for determining sag in a signal.

FIG. 5 illustrates the operation of a sag detection module 500 in a sag detection system. Sag detection module 500 is an example of sag detection module 210, although other examples may exist. Sag detection module 500 includes signal 505, tracking filter 510, max error setting 520, threshold determination module 530, and adder 540. Signal 505 represents a voltage sinusoidal waveform that may be used to power industrial equipment or some other equipment. Upon entry into the system, signal 505 is divided and sent to adder 540 and tracking filter 510.

Tracking filter 510 is configured to take in signal 505, bandwidth 506, and center frequency 507 to filter signal 505. In some examples, tracking filter 510 may comprise a dynamic band pass filter that uses an adjustable bandwidth 506 that changes according to the state of the sag detection system. In some examples, the sag detection system may include an initial or recovering state, which looks for sags in signal 505, and a sag state, which looks for signs of recovery in signal 505.

When in the initial or recovering state, bandwidth 506 will be set to a certain value that is capable of filtering out signals that indicate sag, and center frequency 507 will be a frequency at the center of bandwidth 506. In some examples, the certain value for bandwidth 506 in the initial state may range from 20 to 40 radians/second, but other initial bandwidths are possible. Upon signal 505 passing through tracking filter 510, the filtered signal will then be passed to adder 540. When signal 505 is functioning normally, or as expected, signal 505 subtracted by the filtered signal should indicate a value at or around zero. However, if signal 505 is exhibiting sagging behavior, signal 505 subtracted by the filtered signal should not retain a value of zero. As a result, when compared with a threshold setting, such as maximum error setting 520 at threshold determination module 530, sag indicator 550 should illustrate that the signal has dropped into a sag state. Sag indicator 550 may then be used to change the state of the sag detection system to a sag state.

Once transitioned into the sag state, a bandwidth determination module, such as bandwidth determination module 240, may then increase bandwidth 506. Bandwidth 506 is configured with a lower frequency during the initial or the recovering state to determine when the signal drops into a sag state, and is configured with a higher frequency during the sag state to maintain tracking of the signal. As a result, when it is determined that signal 505 has transitioned back into a recovering state, bandwidth 506 is reduced to the lower frequency band to start monitoring for the next sag.

Although sag determination module 500 includes a single voltage phase signal in the present example, it should be understood that sag determination module 500 could be duplicated to track voltage sags for any number of phases. For example, if it was desired to track three phase power, three sag determination modules, like sag determination module 500, may be used for each of the phases. As a result, each phase would be an input signal for each of the sag detection modules. Further, the sag indicator on each of the sag determination modules may be logically combined using an OR gate to generate an overall sag indicator for the three-phase power system.

Figure 6:
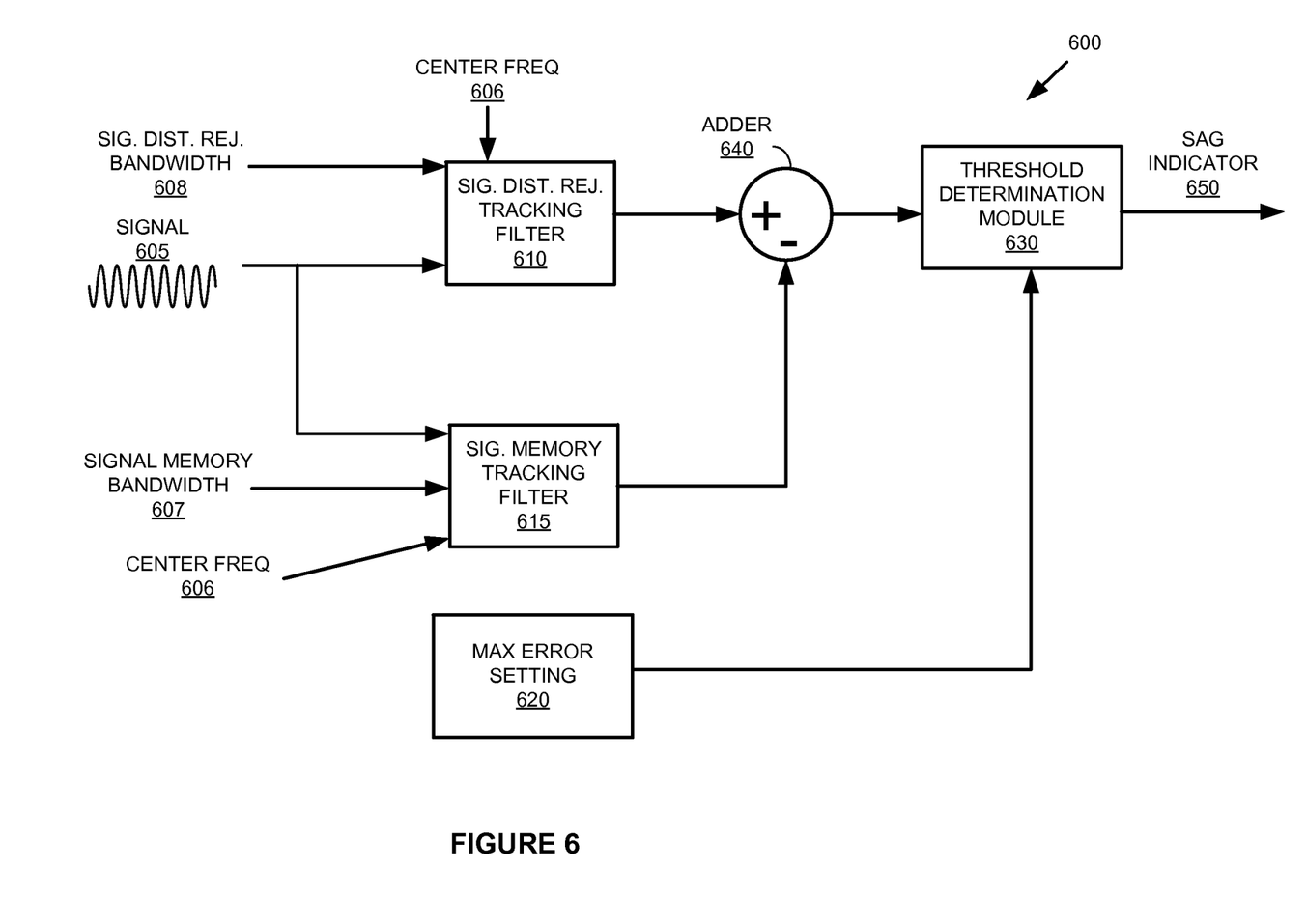
FIG. 6 illustrates a sag determination module for determining sag in a signal.

FIG. 6 illustrates the operation of a sag detection module 600 in a sag detection system. Sag detection module 600 is an example of sag detection module 210, although other examples may exist. Sag detection module 600 includes, signal distortion rejection tracking filter 610, signal memory tracking filter 615, threshold determination module 630, maximum error setting 620, and adder 640.

In operation, the sag detection system may have multiple states that affect the operation of sag detection module 600. These states may include an initial or recovering state that intends to determine when signal 605 drops into a sag state, and a sag state that attempts to determine when signal 605 returns to a recovering or an expected state. To illustrate the operation of sag detection module 600, sag detection system will begin in the initial state.

In the initial state, sag detection module 600 takes in signal 605, which may comprise a sinusoidal voltage waveform, for processing by signal distortion rejection tracking filter 610 and signal memory tracking filter 615. Signal distortion rejection tracking filter 610 is configured to be a band pass filter with center frequency 606 and signal distortion rejection bandwidth 608. Center frequency 606 is configured to the expected frequency of signal 605 when signal 605 is operating normally, and signal distortion rejection bandwidth 608 is typically set to a large value such as 600-800 radians/second to prevent distortion factors in the sag determination. The center frequency can be fed in real time by a frequency detection device such as a phase locked loop. Following the processing by signal distortion rejection tracking filter 610, the signal distortion rejection filtered signal is passed to adder 640.

At the same instance, that signal distortion rejection tracking filter 610 is processing signal 605, signal memory tracking filter 615 is processing signal 605 using center frequency 606 and signal memory bandwidth 607. Center frequency 606 is set to the expected frequency of signal 605, and signal memory bandwidth 607 is set to a bandwidth in the initial or recovering state to determine when signal 605 transitions to a sag state. In some examples, the bandwidth in the initial or recovering state may be 20-40 radians/second, however, other examples may exist. After processing in signal memory tracking filter 615, the sag filtered signal is then also passed to adder 640. In the initial or recovering state, when signal 605 is operating normally, the output of signal distortion rejection tracking filter 610 minus the output of signal memory tracking filter 615 should yield a result that is at or around zero. In contrast, if signal 605 has dropped to a sag state, the output of signal distortion rejection tracking filter 610 minus the output of signal memory tracking filter 615 should yield a result that is farther removed from zero. This result may then be compared using threshold determination module 630 to determine if there should be a change in sag indicator 650. Threshold determination module 630 is configured to take in the output from adder 640 and maximum error setting 620 to determine if the voltage sag is large enough to change sag indicator 650. If the sag is determined to be large enough, then sag indicator 650 will change to the sag state accordingly. However, if the sag is not large enough, then sag indicator 650 will maintain the sag detection system in the initial or recovering state.

Once transitioned into the sag state by sag indicator 650, signal memory bandwidth 607 may be increased based on this transition. The increase in bandwidth 607 will allow signal memory tracking filter 615 to maintain tracking on signal 605 despite the signal dropping to a sag state. Thus, when signal 605 returns to the initial or recovering state, signal memory tracking filter can quickly identify the signal and be prepared to find the next sag in the signal.

Although sag determination module 600 includes a single voltage phase signal in the present example, it should be understood that sag determination module 600 could be duplicated to track voltage sags for any number of phases. For example, if it was desired to track three phase power, three sag determination modules, like sag determination module 600, may be used for each of the phases. As a result, each phase would be an input signal for each of the sag detection modules. Further, the sag indicator on each of the sag determination modules may be logically combined using an OR gate or some other similar device to generate an overall sag indicator for the three phase power system.

Figure 7:
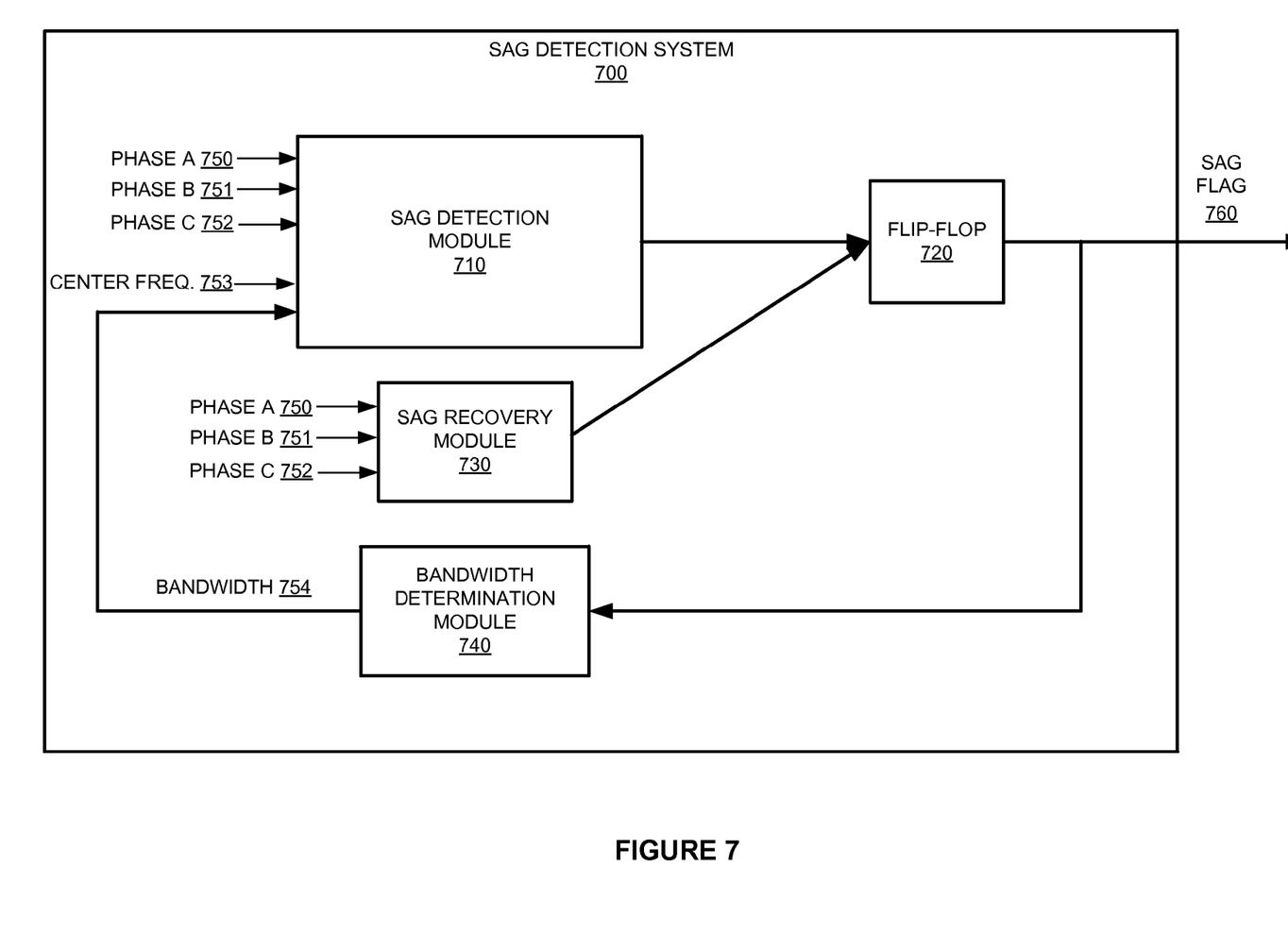
FIG. 7 illustrates a sag detection system for finding sags in multiple input signals that correspond to power phases.

FIG. 7 illustrates a sag detection system 700 capable of determining the sag for multiple input signals. Sag detection system 700 is an example of sag detector 105, although other examples may exist. Sag detection system includes sag detection module 710, flip-flop 720, sag recovery module 730, bandwidth determination module 740, phase signals 750-752, center frequency 753, bandwidth 754 and sag flag 760. Phase signals 750-752 may represent three-phase electric power in some instances.

In the present example, sag detection system 700 may have multiple states represented by sag flag 760. These states may include an initial or recovering state that represents when sag detection system is looking to identify a sag, and a sag state that looks to determine when the signal has recovering from the sag state. To determine these states, input signals, such as phase signals 750-752, are input into sag detection module 710 and sag recovery module 730. Sag detection module 710 is configured to take in phase signals 750-752, center frequency 753, and bandwidth 754 from bandwidth determination module 740. Center frequency 753 is the expected center frequency for all of the phase signals being input into sag detection system 700, and bandwidth 754 is configured to adjust according to the state of sag flag 760 to better track the sags as soon as they occur. When in the initial or recovering state, sag detection module 710 is configured to filter phase signals 750-752 using a first value of bandwidth 754 from bandwidth determination module 740 and center frequency 753. This filter may be an adaptive tracking filter or any other tracking filter capable of applying a band pass filter to the signal. The first value of bandwidth 754 is a smaller value than the value for the bandwidth when system 700 is in the sag state. In some examples, the first value of bandwidth 754 is between 20 and 40 radians/second, but any other values may be used. Based at least on the tracking filter outputs for the signals, sag detection module 710 will provide a signal to flip-flop 720 to reflect when the signal has gone from a non-sag or normal condition to a sag state. Flip-flop 720 may then reflect this change by changing the state of system 700 using sag flag 760.

Upon the change of the system from the initial or recovering state to a sag state, bandwidth determination module 740 will increase bandwidth 754. This increase in bandwidth will allow the filters in sag detection module 710 to continue to track the signals despite the drop into the sag state. If the filters were left at their initial bandwidth, the filters may lose track of the signals and, as a result, be slower at regaining tracking of the signal when the system returns to the recovering state.

Also during the sag state of sag detection system 700, sag recovery module 730 is configured to determine when the signal returns from the sag state. Sag recovery module 730 may take in phase signals 750-752 and determine a magnitude of the space vector for the signals. The space vector magnitude may also be fed directly from a phase locked loop or any other means. If this magnitude is determined to be above a threshold value, sag recovery module 730 may initiate flip-flop 720 to transition back to the recovering state. In turn, sag flag 760 will reflect the change back to the recovering state and bandwidth determination module 740 will decrease bandwidth 754 to determine the next sag.

Figure 8:
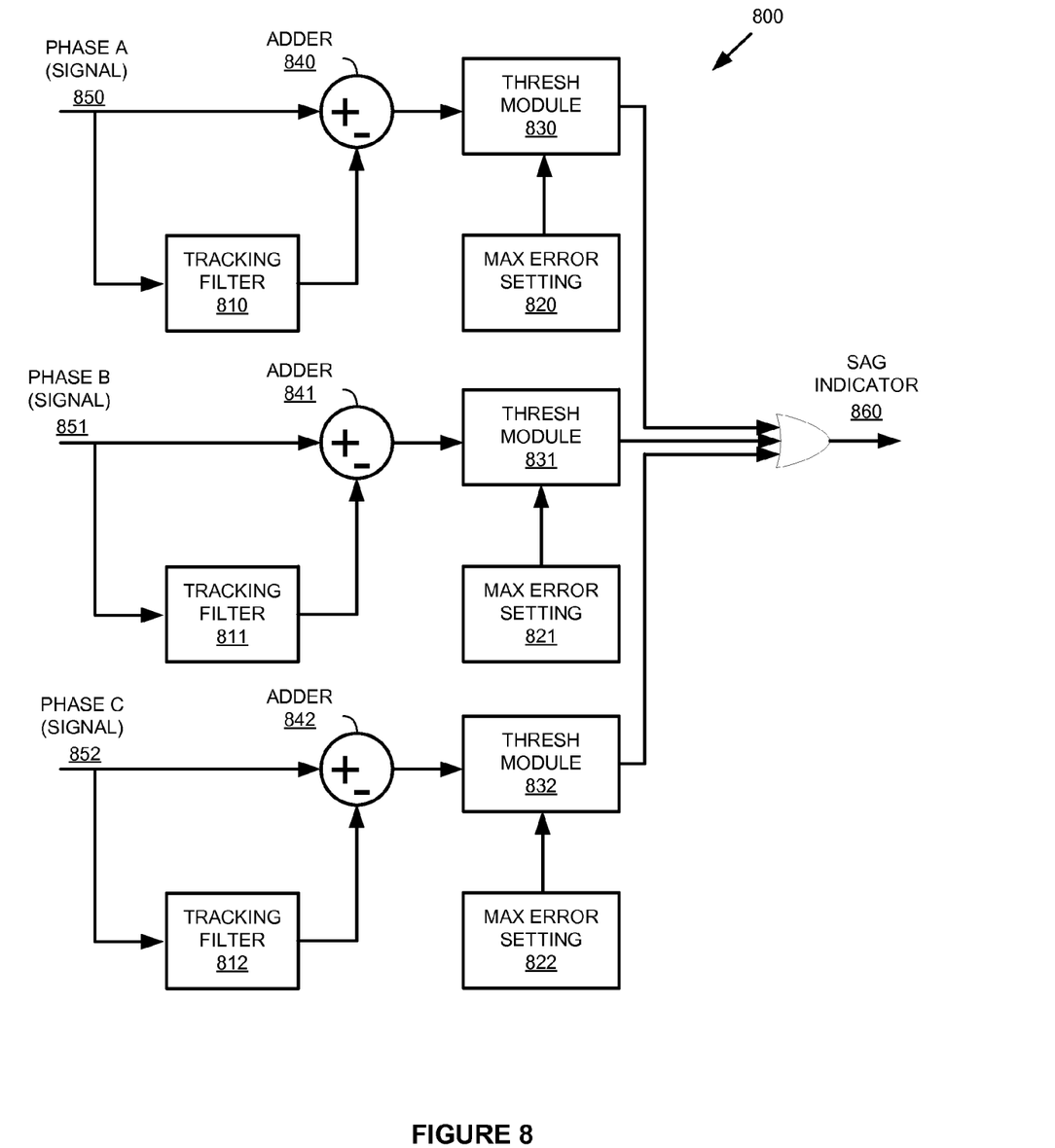
FIG. 8 illustrates a sag detection module that determines sag for multiple signals.

FIG. 8 illustrates a sag detection module 800 that is an example of sag detection module 710. Sag detection module 800 includes tracking filters 810-812, maximum error settings 820-822, threshold modules 830-832, adders 840-842, phase signals 850-852, and a sag indicator 860. Phase signals 850-852 may represent the different phases within three phase power, although sag detection module 800 may be expanded to any number of phases.

In operation, sag detection module 800 includes three sag detection modules from FIG. 5, each configured to receive a different phase signal. When in the initial or recovering state, tracking filters 810-812 are configured to filter the signals using a bandwidth and a center frequency to determine when the signals sag. These filtered signals are then summed using adders 840-842. When the signals are acting normally, the unfiltered signal minus the filtered signal should sum to at or around zero, which indicates that there was no sag. In contrast, if the signals contain a sag, the unfiltered version minus the filtered version should be at a value farther removed from zero. This value may then be compared using threshold modules 830-832 and maximum error settings 820-822 to determine if there is a sag in the system. If the value is below the threshold value contained in maximum error settings 820-822, then sag indicator 860 will remain unchanged and reflect that the module is still looking for a sag state. If however, the value exceeds the threshold, then sag indicator 860 may be changed to reflect the sag in any of phase signals 850-852. Sag indicator 860 may then change the state of the system from the initial or recovering state to a sag state.

Once in the sag state, the bandwidth that is used in tracking filters 810-812 may be increased to better track the sag signals. If the bandwidth were to remain the same, then the tracking filters may have issues tracking the signals again when they return from the sag state. Thus, if a signal quickly went from a sag state to a normal state and back to a sag state, the filter may not be able to track the signal and as a result miss the second sag. However in the present example, the filters will increase the bandwidth during the sag state and, once returned to the initial or recovering state, the bandwidth may be decreased so that sag identification may resume.

Figure 9:
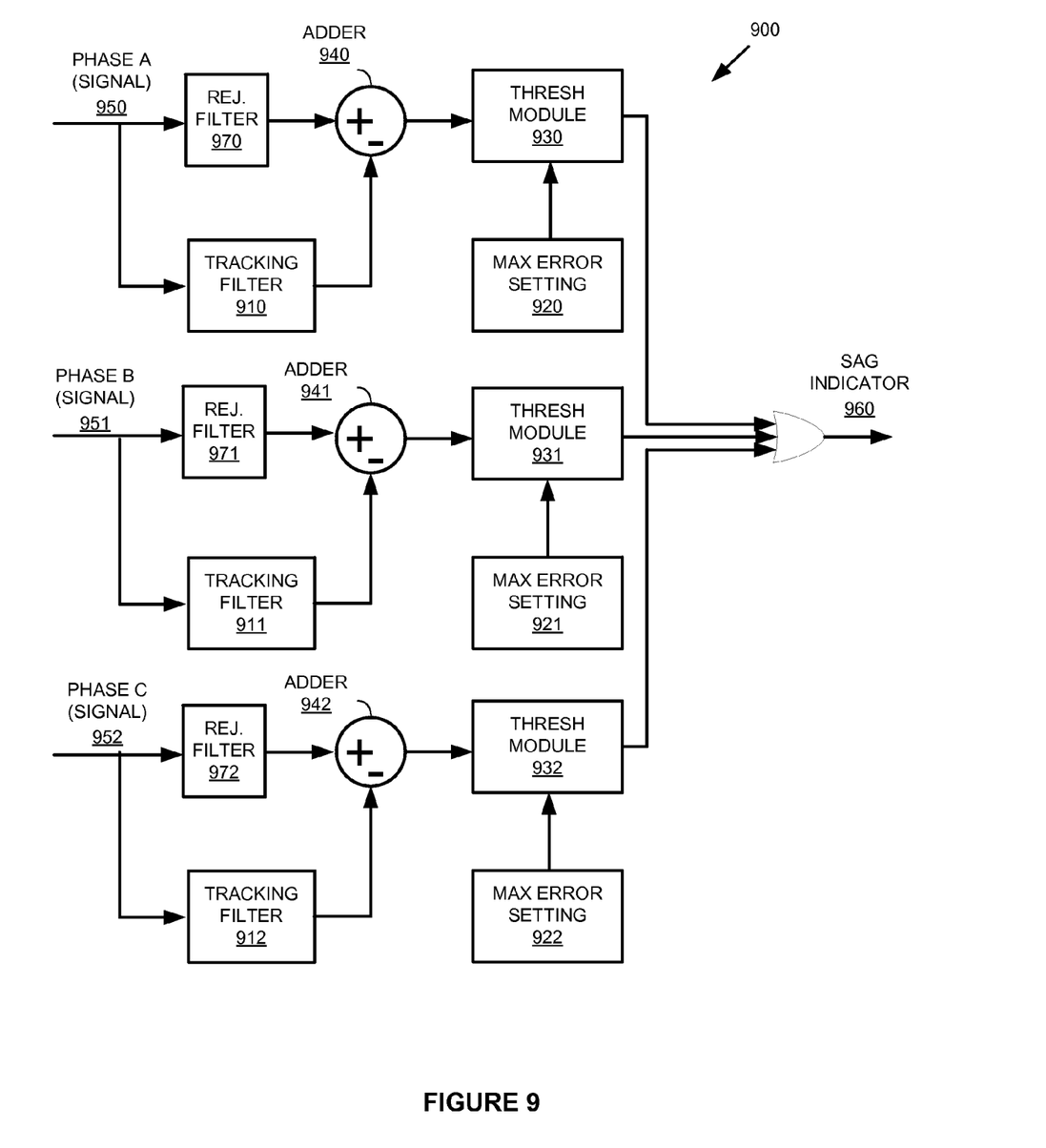
FIG. 9 illustrates a sag detection module that determines sag for multiple signals.

FIG. 9 illustrates a sag detection module 900 and 800 that is an example of sag detection module 710. Sag detection module 900 includes tracking filters 910-912, max error settings 920-922, threshold modules 930-932, adders 940-942, phase signals 950-952, sag indicator 960, and signal distortion rejection filters 970-972. Phase signals 950-952 may represent the different phases within three phase power, although sag detection module 900 may be expanded to any number of phases.

In operation, sag detection module 900 will operate similar to sag detection module 800. The difference in this example is that signal distortion rejection filters 970-972 are used to filter the raw input phase signal prior to forming the differences with the output of the signal memory tracking filters at adders 940-942. By adding this filter, the sag determination may become slower, but may become less sensitive to distortion as the signal is not directly compared with the sag filtered signal. As a result, sag indication may become more accurate. In some examples, signal distortion rejection filters 970-972 may be configured with a bandwidth between 600 and 800 radians/second, although other bandwidth values are possible.

Figure 10:
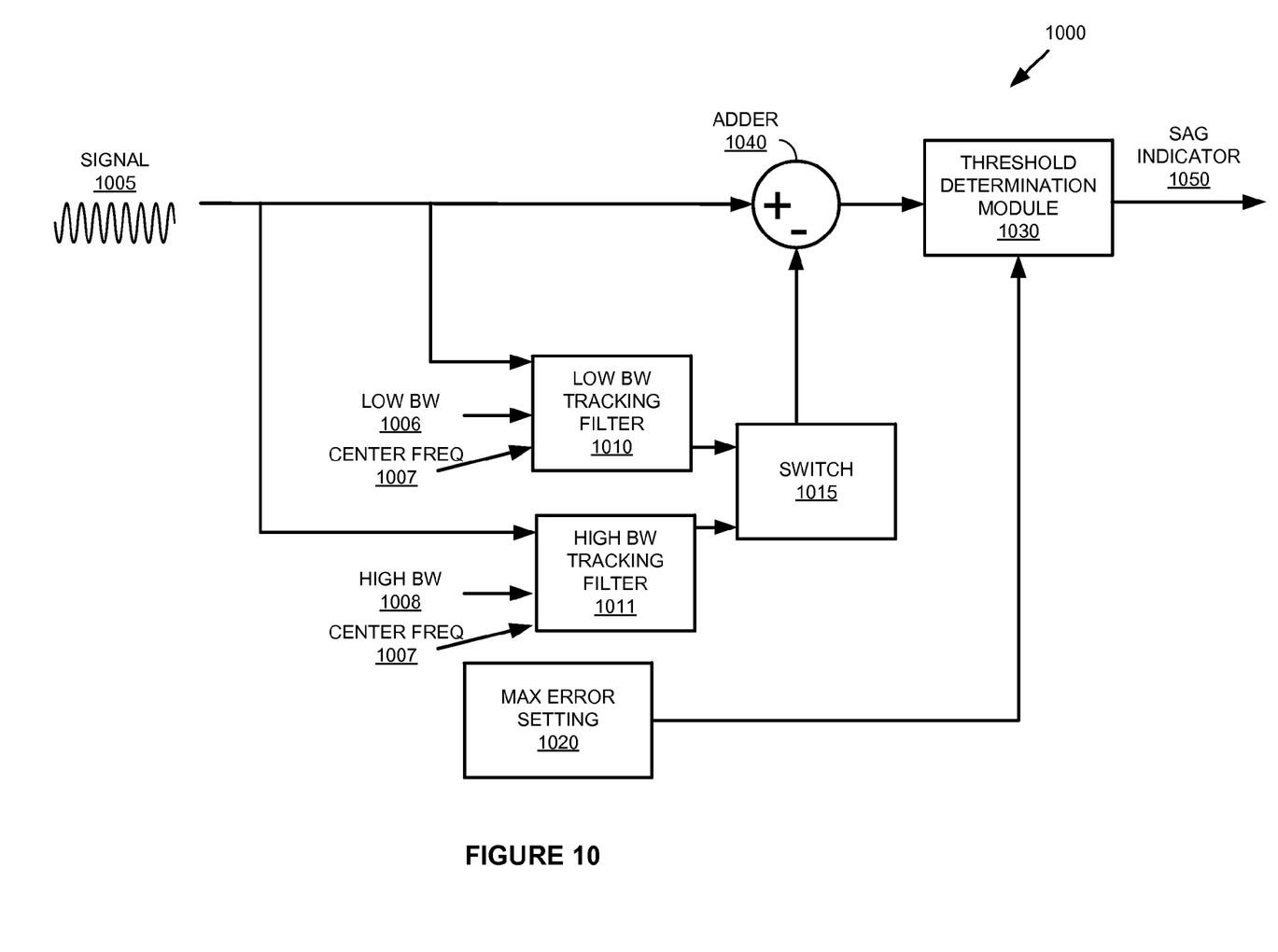
FIG. 10 illustrates a sag determination module for determining sag in signal.

FIG. 10 illustrates a sag determination module 1000 for tracking sag in a signal according to another example. Sag detection module 1000 is an example of sag detection module 210 and sag detector 105, although other examples may exist. Sag detection module 1000 includes signal 1005, low bandwidth tracking filter 1010, high bandwidth tracking filter 1011, switch 1015, max error setting 1020, threshold determination module 1030, and adder 1040. Signal 1005 represents a voltage sinusoidal waveform that may be used to power industrial equipment or some other equipment. Upon entry into the system, signal 1005 is divided and sent to adder 1040 and tracking filters 1010-1011.

In operation, sag determination module 1000 is configured to operate similar to sag determination module 500 illustrated in FIG. 5. Here, instead modifying the tracking filter based on the state of the system, sag determination module 1000 includes low bandwidth tracking filter 1010 that is used when the module is in a recovering or initial sag state, and high bandwidth tracking filter 1011 that is used when the module is in the sag state. When in the initial or recovering state, switch 1015 is configured to take the output from low bandwidth tracking filter 1010. Low bandwidth tracking filter 1010 is configured to take in low bandwidth 1006 and center frequency 1007 to determine sag in much the same way as tracking filter 510. The output of low tracking filter 1010 is then fed, while in the initial or recovering state, to adder 1040 to determine the difference between the filtered signal and the original signal 1005. If the difference in the signals is above a threshold set by max error setting 1020, then threshold determination module 1030 will change sag indicator 1050 into the sag state.

Upon the transition into the sag state, switch 1015 will then start taking the output from high bandwidth tracking filter 1011 to maintain tracking of signal 1005 while signal 1005 is in the sag state. However, once signal 1005 returns to a recovering or initial state, switch 1015 will return to taking input from low bandwidth tracking filter 1010 to ensure the module catches the next sag in the input signal. In some examples, switch 1015 may act as a bandwidth determination module, such as bandwidth determination module 240. Thus, the switch may change based on the status of the system and receive input from low bandwidth tracking filter 1010 or high bandwidth tracking filter 1011 based on the system state.

Although sag determination module 1000 is illustrated as taking input from a single signal in the present example, it should be understood that sag determination module 1000 could be duplicated for any number of phases in a power signal. The sag indicators for each of the phases could then be used to determine if there was any sag in the overall signal.

Referring back to FIG. 1, power source 103 may include a power station, a generator, or any other similar form of power generation capable of generating power for industrial equipment 110-112. Power source 103 may generate power with a single phase signal, may generate power with a three phase signal, or may generate power in any other alternating current form with any number of phases.

Industrial equipment 110-112 may include any device that requires power in an industrial environment. Such devices may include motors, actuators, hydraulics, or any other similar mechanical or electrical component. Industrial equipment 110-112 may further include controllers and management devices for the mechanical and electrical components to ensure the equipment operates correctly. Also, the industrial equipment might represent a smaller scale micro grid integrated to a larger power system.

Sag detector 105 is configured to determine sag in the signal from power source 103 and communicate information about this sag to industrial equipment 110-112. Sag detector 105 may comprise at least one field programmable gate array (FPGA), at least one application-specific integrated circuit (ASIC), or any other apparatus capable of operating as described herein. Although illustrated separate from industrial equipment 110-112, it should be understood that sag detector 105 may be implemented wholly or partially on the equipment 110-112. Further, although a single sag detector is illustrated in the present example, any number of sag detectors may be used for the industrial equipment including a sag detector for each individual device.

Power link 120 may comprise a power line, a transformer, or any other conductive device capable of carrying alternating current power to sag detector 105—including combinations there of. Communication links 121 may use metal, glass, air, space, or some other material as the transport media. Communication links 121 could use various communication protocols, such as Time Division Multiplex (TDM), Internet Protocol (IP), Ethernet, communication signaling, or some other communication format—including combinations thereof. Further communication links 121 may not be necessary if sag detector 105 resides on the industrial equipment.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A method of tracking sag in a power signal supplied to industrial equipment, the method comprising:
    determining, via a sag detection module coupled to a cable carrying the power signal, when an amplitude of the power signal transitions to an amplitude level below a threshold value based at least on an output of a tracking filter having a first bandwidth;
    indicating, via a sag state device coupled to an output of the sag detection module, a sag state of the power signal when the amplitude level of the power signal is below the threshold value;
    setting, via a bandwidth determination module coupled to an output of the sag state device, a bandwidth of the tracking filter to a second bandwidth different from the first bandwidth when the sag state device indicates the sag state;
    determining, via a sag recovery module coupled to the cable, when the amplitude of the power signal transitions to an amplitude level above the threshold value based at least on the output of the tracking filter having the second bandwidth; and
    setting, via the bandwidth determination module, the bandwidth of the tracking filter to the first bandwidth when the amplitude level of the power signal is above the threshold value.

2. The method of claim 1, wherein the tracking filter comprises a dynamic band pass filter.

3. The method of claim 1, wherein the power signal comprises a sinusoidal voltage waveform.

4. The method of claim 1, wherein the power signal in the sag state comprises a smaller amplitude than the signal in the initial state.

5. The method of claim 1, wherein the tracking filter comprises an adaptive tracking filter.

6. The method of claim 1, further comprising:
    determining, via the sag recovery module, a space vector magnitude for the power signal; and
    identifying, via the sag recovery module, a transition of the amplitude of the power signal from an amplitude level below the threshold to an amplitude level above the threshold based on the space vector magnitude for the power signal.

7. The method of claim 1, further comprising indicating, via the sag state device, a recovering state of the power signal when the amplitude level of the power signal is above the threshold value.

8. An apparatus for tracking sag in a power signal, the apparatus comprising:
    a sag detector coupleable to a power cable configured to supply the power signal to a device, the sag detector configured to:
        when in an initial state, monitor the power signal and determine a first sag state of the power signal when an amplitude of the power signal transitions to an amplitude level below a threshold value based at least on an output of a tracking filter with an initial bandwidth;
        when in the first sag state, monitor the power signal using a second bandwidth that is different from the initial bandwidth in response to determining the first sag state and determine a recovering state of the signal when the amplitude of the power signal transitions to an amplitude level above the threshold value initiate tracking of the power signal; and
        when in the recovering state, monitor the power signal using the initial bandwidth in response to determining the recovering state and determine a second sag state of the power signal when the amplitude of the power signal transitions to an amplitude level below the threshold value.

9. The apparatus of claim 8, wherein the second bandwidth is wider than the initial bandwidth.

10. The apparatus of claim 8, wherein the power signal comprises a sinusoidal voltage waveform.

11. The apparatus of claim 8, wherein the amplitudes of the power signal in the first and second sag states comprise a smaller amplitude than the amplitude of the signal in the initial state.

12. The apparatus of claim 8, wherein the tracking filter comprises an adaptive tracking filter.

13. The apparatus of claim 8, wherein the sag detector, when in the first sag state, is further configured to:
    determine a space vector magnitude for the power signal; and
    determine the recovering state based on at least the space vector magnitude.

14. The apparatus of claim 8, wherein the sag detector is further configured to:
    filter distortion from the power signal using a band pass filter.

15. An apparatus for tracking sag in a plurality of phase signals, the apparatus comprising:
    a sag detector coupleable to a power cable configured to supply the plurality of phase signals to a device, the sag detector configured to:

when in an initial state, monitor at least one of the plurality of phase signals and determine from the monitoring a sag state based on transition of an amplitude level of the at least one of the plurality of phase signals to an amplitude level below a threshold value and based at least on an output of at least one of a plurality of tracking filters with an initial bandwidth;

when in the sag state, monitor the at least one of the plurality of phase signals and determine from the monitoring a recovering state based on a transition of an amplitude level of the at least one of the plurality of phase signals to an amplitude level above the threshold value and based at least on an output of at least one of a plurality of tracking filters with a second bandwidth that is different from the initial bandwidth; and when in the recovering state, monitor the at least one of the plurality of phase signals and determine from the monitoring a transition of an amplitude level of the at least one of the plurality of phase signals to an amplitude level below the threshold value and based at least on an output of at least one of a plurality of tracking filters with the initial bandwidth.

16. The apparatus of claim 15, wherein the plurality of phase signals comprise a three phase power signal.

17. The apparatus of claim 15, wherein the plurality of tracking filters comprise a plurality of dynamic band pass filters.

18. The apparatus of claim 15, wherein the plurality of tracking filters comprise a plurality of adaptive tracking filters.

19. The apparatus of claim 15, wherein the sag detector, when in the sag state, is further configured to:

determine a space vector magnitude for the plurality of phase signals and determine the recovering state based on at least the space vector magnitude.

\* \* \* \* \*